United States Patent
Pai et al.

(10) Patent No.: US 8,458,645 B2
(45) Date of Patent: Jun. 4, 2013

(54) ELECTRONIC DEVICE AND METHOD FOR CHECKING LAYOUT OF PRINTED CIRCUIT BOARD

(75) Inventors: Chia-Nan Pai, Tu-Cheng (TW); Shou-Kuo Hsu, Tu-Cheng (TW); Ya-Ling Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/407,768

(22) Filed: Feb. 29, 2012

(65) Prior Publication Data

US 2012/0331437 A1    Dec. 27, 2012

(30) Foreign Application Priority Data

Jun. 27, 2011   (CN) .......................... 2011 1 0175436

(51) Int. Cl.
*G06F 17/50* (2006.01)
*G06F 15/04* (2006.01)

(52) U.S. Cl.
USPC .......................................... 716/137; 716/139

(58) Field of Classification Search
USPC ................................... 716/137, 139
See application file for complete search history.

(56) References Cited

U.S. PATENT DOCUMENTS

| | | | | |
|---|---|---|---|---|
| 2012/0096422 A1* | 4/2012 | Hsieh | ............................ | 716/126 |
| 2012/0110539 A1* | 5/2012 | Birch et al. | .................... | 716/130 |
| 2012/0159411 A1* | 6/2012 | Nojima et al. | ................. | 716/111 |
| 2012/0240094 A1* | 9/2012 | Kumagai et al. | .............. | 716/130 |

* cited by examiner

*Primary Examiner* — Suresh Memula
(74) *Attorney, Agent, or Firm* — Altis Law Group, Inc.

(57) ABSTRACT

In a method for checking layout of a printed circuit board (PCB) using an electronic device, a signal line is selected from a layout diagram of the PCB. The method searches for signal lines which have an acute angle when deviating from a straight line in the layout diagram of the PCB. The method further locates attribute data of the searched signal lines in the layout diagram of the PCB, and displays the attribute data of the searched signal lines on a display device of the electronic device.

20 Claims, 4 Drawing Sheets

ELECTRONIC DEVICE AND METHOD FOR CHECKING LAYOUT OF PRINTED CIRCUIT BOARD

BACKGROUND

1. Technical Field

Embodiments of the present disclosure relate to printed circuit board design technology, and particularly to an electronic device and method for checking a layout of a printed circuit board using the electronic device.

2. Description of Related Art

Printed circuit board (PCB) layout is important in a manufacturing process of a motherboard and is closely related to product quality. If a signal line of an element (e.g., a voltage regulator) in a PCB is bent at an acute angle, then interference noise may be generated. The interference noise can interface with a differential signal transmitted by the signal line. The signal lines which are bent at an acute angle (i.e., signal lines which do not meet design criteria) are checked manually, it is a time-consuming work and prone to mistakes. Therefore, a more efficient method for checking a layout of a printed circuit board is desired.

DETAILED DESCRIPTION

All of the processes described below may be embodied in, and fully automated via, functional code modules executed by one or more general purpose electronic devices or processors. The code modules may be stored in any type of non-transitory computer-readable medium or other storage device. Some or all of the methods may alternatively be embodied in specialized hardware. Depending on the embodiment, the non-transitory computer-readable medium may be a hard disk drive, a compact disc, a digital video disc, a tape drive or other suitable storage medium.

Figure 1:
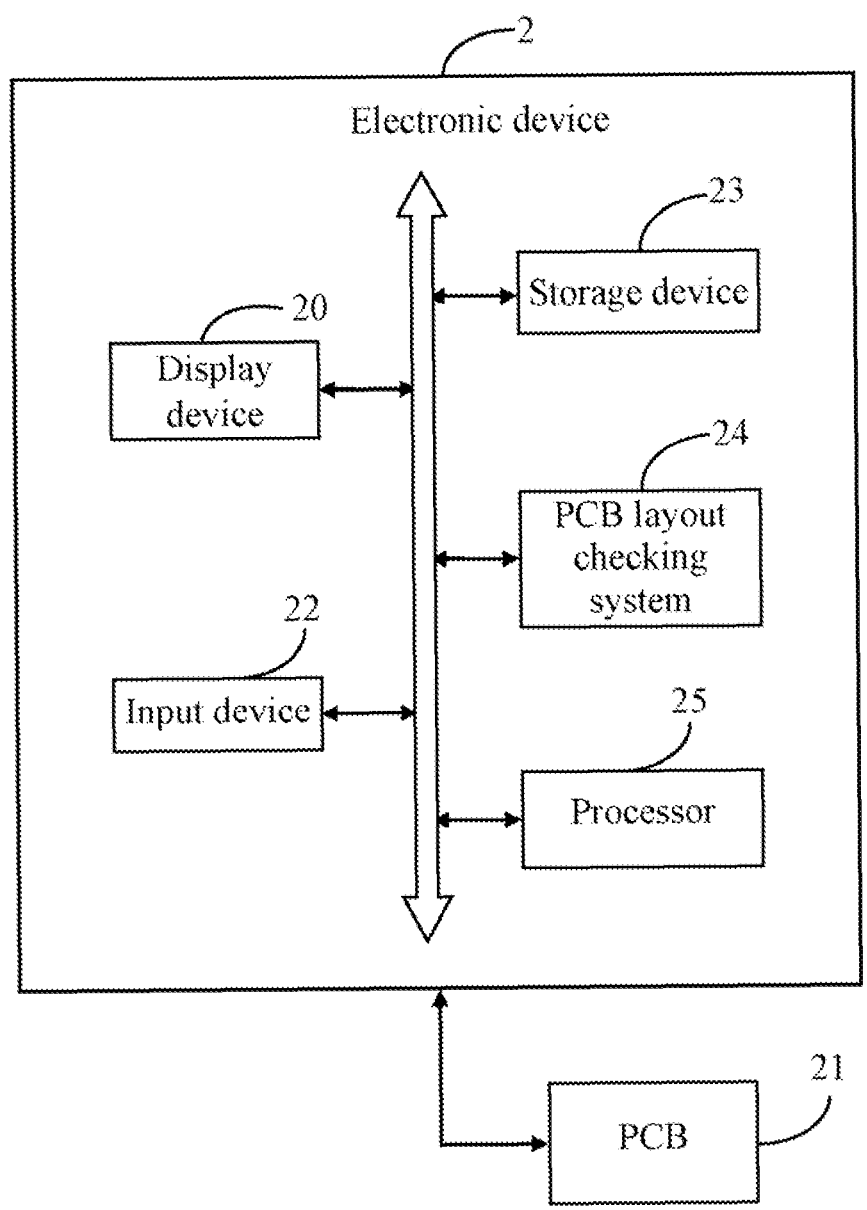
FIG. 1 is a block diagram of one embodiment of an electronic device including a PCB layout checking system.

FIG. 1 is a block diagram of one embodiment of an electronic device 2 including a printed circuit board (PCB) layout checking system 24. In the embodiment, the electronic device 2 is electronic connected with a PCB 21 under test. The electronic device 2 further includes a display device 20, an input device 22, a storage device 23, and at least one processor 25. The electronic device 2 may be a computer, a server, or any other computing device. In other embodiment, the PCB 21 may be installed in the electronic device 2. It should be understood that FIG. 1 illustrates only one example of the electronic device 2 that may include more or fewer components than illustrated, or a different configuration of the various components in other embodiments.

The display device 20 is used to display an electronic layout diagram (hereinafter referred to as "layout diagram") of the PCB 21, and the input device 22 may be a mouse, a keyboard, a touch screen, and/or a touchpad used to input computer readable data.

The PCB layout checking system 24 is used to search for signal lines in the layout diagram of the PCB 21 that do not comply with a layout criterion (unqualified signal lines) of the PCB 21, and locate positions of the searched signal lines in the layout diagram. "Signal lines" as used herein include lines for the transmission of power and/or digital signals. In one embodiment, the PCB layout checking system 24 may include computerized instructions in the form of one or more programs that are executed by the at least one processor 25 and stored in the storage device 23 (or memory). A detailed description of the PCB layout checking system 24 will be given in the following paragraphs. The layout diagram may include detailed specifications of components and dimensions of the PCB 21 including resistors, capacitors, the signal lines, and integrated circuits.

Figure 2:
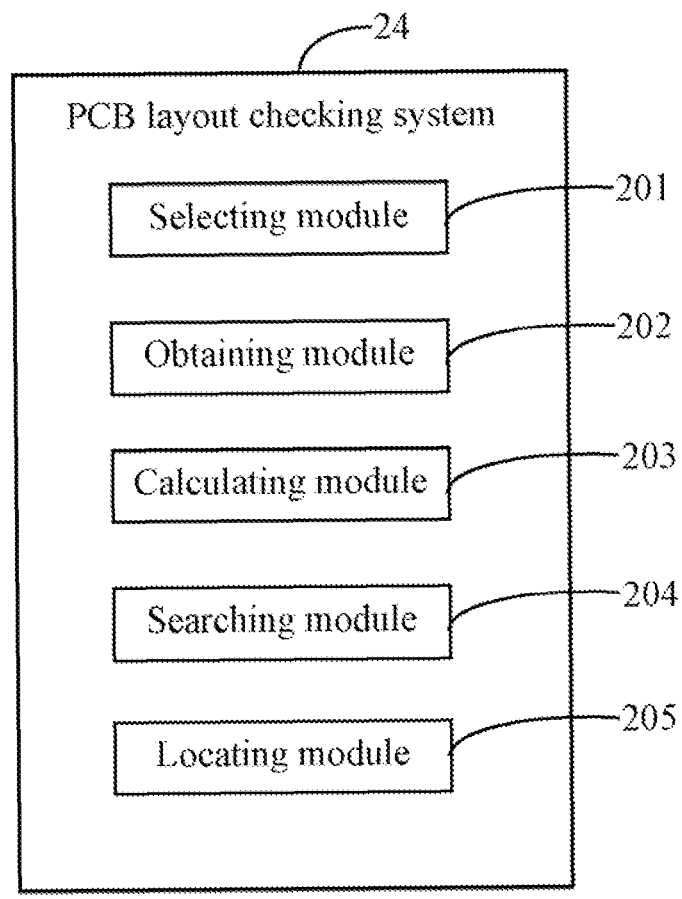
FIG. 2 is a block diagram of function modules of the PCB layout checking system included in the electronic device.

FIG. 2 is a block diagram of function modules of the PCB layout checking system 24 included in the electronic device 2. In one embodiment, the PCB layout checking system 24 may include one or more modules, for example, a selecting module 201, an obtaining module 202, a calculating module 203, a searching module 204, and a locating module 205. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

Figure 3:
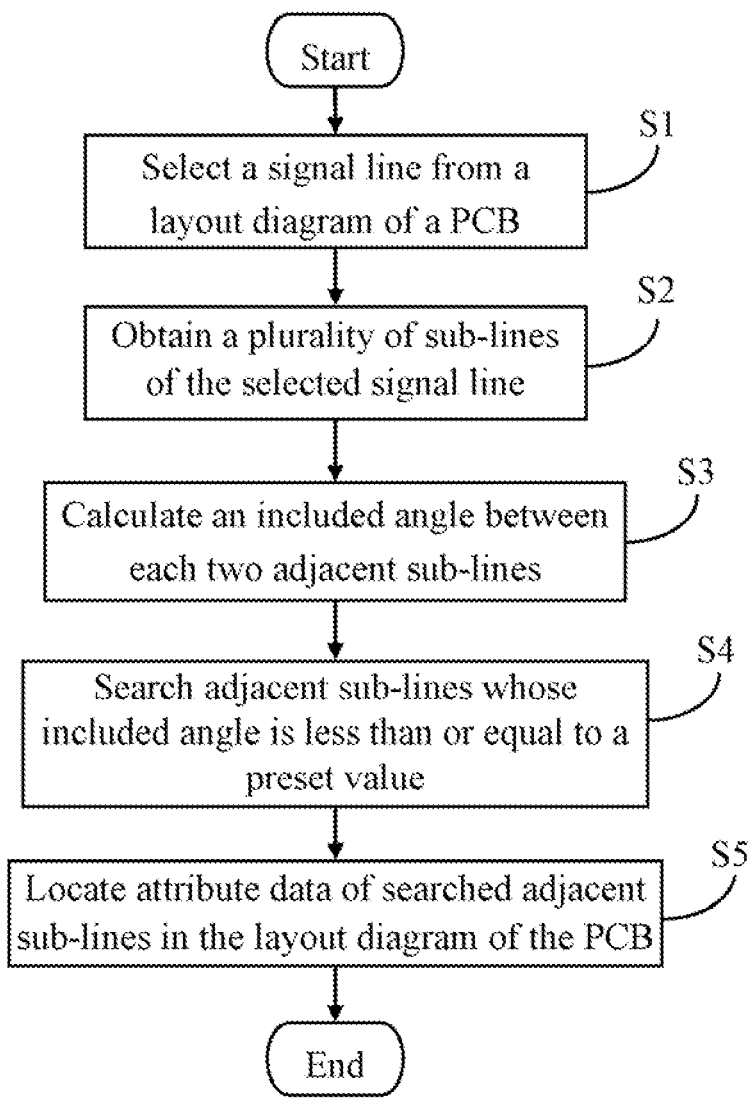
FIG. 3 is a flowchart of one embodiment of a method for checking a layout of a printed circuit board using the electronic device.

FIG. 3 is a flowchart of a first embodiment of a method for checking PCB layout using the electronic device 2. Depending on the embodiment, additional blocks may be added, others removed, and the ordering of the blocks may be changed.

In block S1, the selecting module 201 selects a signal line from the layout diagram of the PCB 21. In one embodiment, the layout diagram is stored in the storage device 23 of the electronic device 2. It is should be understood that a plurality of signal lines may be selected simultaneously in other embodiments.

Figure 4:
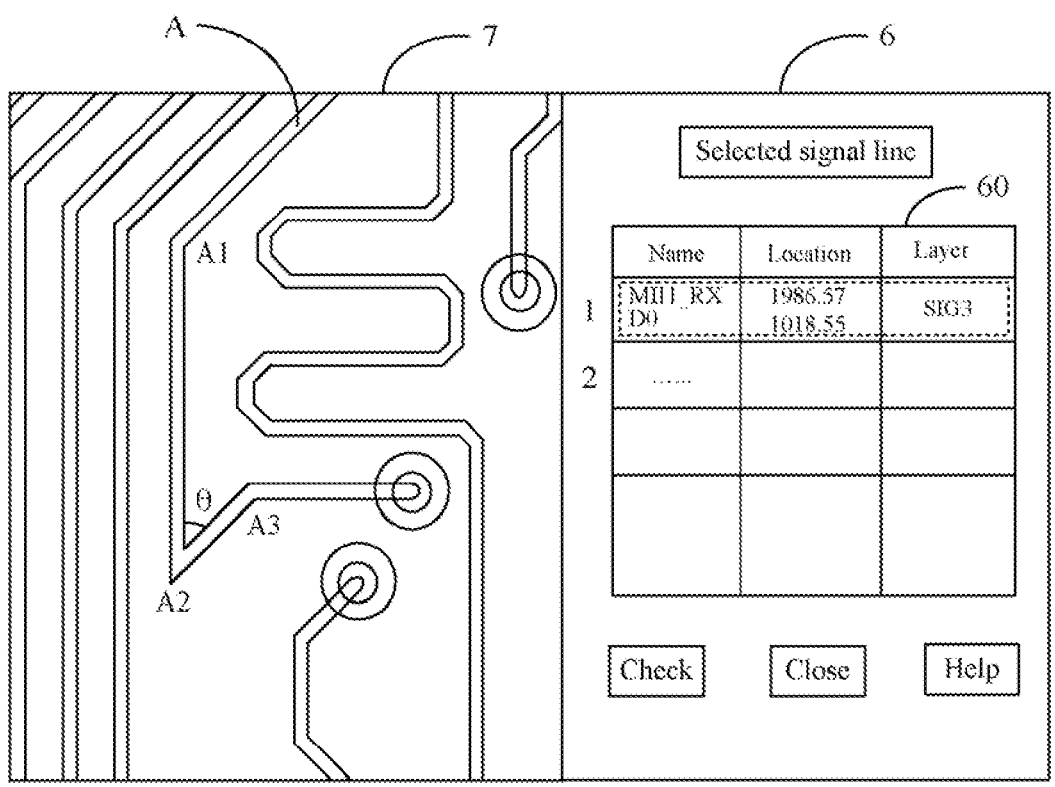
FIG. 4 is a schematic diagram of a graphical interface provided by the PCB layout checking system.

In block S2, the obtaining module 202 obtains a plurality of sub-lines of the selected signal line. In one embodiment, the sub-lines of the selected signal line are obtained by dividing the selected signal line according to one or more inflexions of the selected signal line. That is to say, the inflexions of the selected signal line are the points at which the signal line deviates from a straight line, and the inflexions represent the intersection points between the sub-lines. For example, as shown in FIG. 4, a signal line "A" in a layout diagram 7 is divided into a plurality of straight sub-lines, such as "A1-A2," "A2-A3." The points "A1," "A2," and "A3" represent inflexions of the signal line "A".

In block S3, the calculating module 203 calculates an included angle between each two adjacent sub-lines of the selected signal line. In one embodiment, the adjacent sub-lines are located on a same layer (e.g., a signal layer) of the PCB 21.

In block S4, the searching module 204 searches adjacent sub-lines whose included angle is less than or equal to a preset value, and stores attribute data of searched adjacent sub-lines into the storage device 23. In one embodiment, the attribute data of the searched adjacent sub-lines may include a name of the selected signal line, coordinates of the intersection points between the searched adjacent sub-lines, and a layer of the searched adjacent sub-lines in the PCB 21. If the included angle between two adjacent sub-lines is less than or equal to the present value, the two adjacent sub-lines are determined to be unqualified (i.e., the inflexion between the two adjacent sub-lines is unqualified). That is to say, the layout of the selected signal line does not comply with the layout criterion/criteria of the PCB 21.

In one embodiment, the preset value is ninety degrees. For example, if a cosine of the included angle between adjacent sub-lines is greater than or equal to zero, the searching module 204 determines that the layout of the adjacent sub-lines are unqualified signal lines. As shown in FIG. 4, supposing that "θ" represents the included angle between "A1-A2" and "A2-A3," if Cos(θ)>0, the adjacent sub-lines of "A1-A2" and "A2-A3" are determined to be unqualified. In another embodiment, the searching module 204 may determine whether the layout of the adjacent sub-lines are qualified by calculating other values (e.g., a sine value) of the included angle between adjacent sub-lines.

In block S5, the locating module 205 locates the attribute data of the searched adjacent sub-lines (i.e., the adjacent sub-lines found in block S4) in the layout diagram of the PCB 21 using a graphical interface 6 (as shown in FIG. 4), and outputs the attribute data of all the searched adjacent sub-lines into a layout checking report 60. For example, as shown in FIG. 4, if the positions of any unqualified sub-lines needs to be located, the user may select two adjacent sub-lines from the layout checking report 60 to check. Then, the locating module 205 locates the positions of the selected sub-lines in the layout diagram of the PCB 21 using the graphical interface 6.

In another embodiment, the locating module 205 may mark the adjacent sub-lines with a preset color in the layout diagram of the PCB 21 when those adjacent sub-lines are selected. For example, the sub-lines of "A1-A2" and "A2-A3" may be highlighted in red. Furthermore, the locating module 205 displays the attribute data of all the searched adjacent sub-lines on the display device 20, and stores the layout checking report 60 in the storage device 23 of the electronic device 2.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer-implemented method for checking layout of a printed circuit board (PCB) using an electronic device comprising a processor, the method comprising execution of the steps comprising:
    selecting a power line from an electronic layout diagram of the PCB, the electronic layout diagram stored in a storage device of the electronic device;
    obtaining a plurality of sub-lines of the selected signal line;
    calculating an included angle between each two adjacent sub-lines of the selected signal line;
    searching adjacent sub-lines whose included angle is less than or equal to a preset value; and
    locating attribute data of searched adjacent sub-lines in the electronic layout diagram of the PCB, and outputting the attribute data of the searched adjacent sub-lines into a layout checking report.

2. The method according to claim 1, wherein the sub-lines of the selected signal line are obtained by dividing the selected signal line according to one or more inflexions of the selected signal line.

3. The method according to claim 2, wherein the inflexions of the selected signal line are intersection points of the sub-lines.

4. The method according to claim 1, wherein the preset value is ninety degrees, and the layout of the adjacent sub-lines being determined to be unqualified upon the condition that a cosine of the included angle between the adjacent sub-lines is greater than or equal to zero.

5. The method according to claim 1, wherein the attribute data of the searched adjacent sub-lines comprise a name of the selected signal line, coordinates of intersection points of the searched adjacent sub-lines, and a layer of the searched adjacent sub-lines in the PCB.

6. The method according to claim 1, wherein the method further comprises: locating a position of two adjacent sub-lines in the electronic layout diagram of the PCB upon the condition that the two adjacent sub-lines are selected from the layout checking report.

7. The method according to claim 6, wherein the method further comprises: marking the two adjacent sub-lines with a preset color in the electronic layout diagram of the PCB upon the condition that the two adjacent sub-lines are selected.

8. An electronic device, comprising:
    a storage device;
    at least one processor; and
    one or more modules that are stored in the storage device and executed by the at least one processor, the one or more modules comprising:
        a selecting module that selects a power line from an electronic layout diagram of a printed circuit board (PCB), the electronic layout diagram stored in the storage device;
        an obtaining module that obtains a plurality of sub-lines of the selected signal line;
        a calculating module that calculates an included angle between each two adjacent sub-lines of the selected signal line;
        a searching module that searches adjacent sub-lines whose included angle is less than or equal to a preset value; and
        a locating module that locates attribute data of searched adjacent sub-lines in the electronic layout diagram of the PCB.

9. The electronic device according to claim 8, wherein the sub-lines of the selected signal line are obtained by dividing the selected signal line according to one or more inflexions of the selected signal line.

10. The electronic device according to claim 9, wherein the inflexions of the selected signal line are intersection points of the sub-lines.

11. The electronic device according to claim 8, wherein the preset value is ninety degrees, and the layout of the adjacent sub-lines being determined to be unqualified upon the condition that a cosine of the included angle between the adjacent sub-lines is greater than or equal to zero.

12. The electronic device according to claim 8, wherein the attribute data of the searched adjacent sub-lines comprise a name of the selected signal line, coordinates of intersection points of the searched adjacent sub-lines, and a layer of the searched adjacent sub-lines in the PCB.

13. The electronic device according to claim 8, wherein the locating module further locates a position of two adjacent sub-lines in the electronic layout diagram of the PCB upon the condition that the two adjacent sub-lines are selected from the layout checking report.

14. The electronic device according to claim 13, wherein the locating module further marking the two adjacent sub-lines with a preset color in the electronic layout diagram of the PCB upon the condition that the two adjacent sub-lines are selected.

15. A non-transitory storage medium having stored thereon instructions that, when executed by a processor of an electronic device, causes the electronic device to perform a method for checking layout of a printed circuit board (PCB), the method comprising:

selecting a power line from an electronic layout diagram of the PCB, the electronic layout diagram stored in a storage device of the electronic device;

obtaining a plurality of sub-lines of the selected signal line;

calculating an included angle between each two adjacent sub-lines of the selected signal line;

searching adjacent sub-lines whose included angle is less than or equal to a preset value; and locating attribute data of searched adjacent sub-lines in the electronic layout diagram of the PCB, and outputting the attribute data of the searched adjacent sub-lines into a layout checking report.

16. The non-transitory storage medium according to claim 15, wherein the sub-lines of the selected signal line are obtained by dividing the selected signal line according to one or more inflexions of the selected signal line.

17. The non-transitory storage medium according to claim 16, wherein the inflexions of the selected signal line are intersection points of the sub-lines.

18. The non-transitory storage medium according to claim 15, wherein the preset value is ninety degrees, and the layout of the adjacent sub-lines being determined to be unqualified upon the condition that a cosine of the included angle between the adjacent sub-lines is greater than or equal to zero.

19. The non-transitory storage medium according to claim 15, wherein the attribute data of the searched adjacent sub-lines comprise a name of the selected signal line, coordinates of intersection points of the searched adjacent sub-lines, and a layer of the searched adjacent sub-lines in the PCB.

20. The non-transitory storage medium according to claim 15, wherein the method further comprises: locating a position of two adjacent sub-lines in the electronic layout diagram of the PCB upon the condition that the two adjacent sub-lines are selected from the layout checking report.

\* \* \* \* \*